United States Patent [19]
Tehrani et al.

[11] Patent Number: 5,489,785
[45] Date of Patent: Feb. 6, 1996

[54] BAND-TO-BAND RESONANT TUNNELING TRANSISTOR

[75] Inventors: Saied N. Tehrani, Scottsdale; Jun Shen, Phoenix; Herbert Goronkin, Tempe; Xiaodong T. Zhu, Chandler, all of Ariz.

[73] Assignee: Motorola, Schaumburg, Ill.

[21] Appl. No.: 209,789

[22] Filed: Mar. 11, 1994

[51] Int. Cl.⁶ .................................................. H01L 27/12
[52] U.S. Cl. .................... 257/23; 257/24; 257/25; 257/197
[58] Field of Search .................... 257/25, 23, 24, 257/197, 26, 27, 192

[56] References Cited

U.S. PATENT DOCUMENTS

| | | | |
|---|---|---|---|
| 4,712,121 | 12/1987 | Yokoyama | 257/26 |
| 5,113,231 | 5/1992 | Söderström et al. | 257/25 |
| 5,289,014 | 2/1994 | Goronkin et al. | 257/24 |
| 5,349,202 | 9/1994 | Uemura | 257/25 |
| 5,414,274 | 5/1995 | Goronkin et al. | 257/192 |

FOREIGN PATENT DOCUMENTS

| | | | |
|---|---|---|---|
| 63-318782 | 12/1988 | Japan | 257/25 |
| 1-214164 | 8/1989 | Japan | 257/26 |
| 1-265560 | 10/1989 | Japan | 257/197 |

OTHER PUBLICATIONS

Longenbach et al., "Resonant interband tunneling in InAs/GaSb/AlSb/InAs and GaSb/InAs/AlSb/GaSb heterostructures," Applied Physics Letters, 57(15), Oct. 1990, pp. 1554–1556.

Collins et al., "Experimental observation of large room–temperature current gains in a Stark effect transistor," Applied Physics Letters, 58(15), Apr. 1991, pp. 1673–1675.

*Primary Examiner*—Sara W. Crane
*Assistant Examiner*—Courtney A. Bowers
*Attorney, Agent, or Firm*—Eugene A. Parsons

[57] ABSTRACT

A band-to-band resonant tunneling transistor including GaSb and InAs resonant tunneling layers separated by a thin barrier layer and a second InAs layer separated from the GaSb layer by another thin barrier layer. A terminal on the InAs resonant tunneling layer and a terminal on the second InAs layer. Leakage current reduction layers are positioned on the second InAs layer with a bias terminal positioned thereon. The InAs resonant tunneling layer has a plurality of quantized states which are misaligned with the ground state of the GaSb layer in a quiescent state, each of the quantized states of the InAs resonant tunneling layer are movable into alignment with the ground state of the GaSb layer to provide current flow through the transistor with the application of a specific potential to the terminal on the second InAs layer.

21 Claims, 3 Drawing Sheets

BAND-TO-BAND RESONANT TUNNELING TRANSISTOR

FIELD OF THE INVENTION

The present invention pertains to heterojunction transistors and more specifically to negative differential resistance transistors.

BACKGROUND OF THE INVENTION

Three classes of resonant tunneling transistors have been constructed and/or proposed in the literature. Examples of these structures are: a resonant tunneling emitter transistor; a hot electron transistor; and a quantum well resonant tunneling base transistor. Each of these structures uses the alignment of quantized energy levels in the conduction band of the quantum well to achieve negative differential resistance. The major problem is that all of these structures have a low peak-to-valley current ratio and are mostly functional at low temperatures. Further, it is difficult to contact theses structures (e.g. base, emitter, collector or gate, source, drain) without incurring unacceptable amounts of leakage current between contacts.

Accordingly, a resonant tunneling transistor with increased peak-to-valley current and reduced contact leakage current is highly desirable.

It is a purpose of the present invention to provide a new and improved band-to-band resonant tunneling transistor.

It is another purpose of the present invention to provide a new and improved band-to-band resonant tunneling transistor with substantially increased peak-to-valley current.

It is still another purpose of the present invention to provide a new and improved band-to-band resonant tunneling transistor with minimized intercontact leakage current.

It is yet another purpose of the present invention to provide a new and improved band-to-band resonant tunneling transistor with substantially reduced access resistance.

SUMMARY OF THE INVENTION

The above problems and others are substantially solved and the above purposes and others are realized in a band-to-band resonant tunneling transistor including GaSb and InAs resonant tunneling layers separated by a thin barrier layer and a second InAs layer separated from the GaSb resonant tunneling layer by another thin barrier layer. A terminal connected to the InAs resonant tunneling layer and a terminal connected to the second InAs layer. One or more leakage current reduction layers are positioned on the InAs resonant tunneling layer and a bias terminal is positioned thereon and coupled to the InAs resonant tunneling layer. The InAs resonant tunneling layer has a plurality of quantized states all of which are misaligned with the ground state quantized level of the GaSb resonant tunneling layer in a quiescent state, each of the quantized levels of the InAs resonant tunneling layer are movable into alignment with the ground state quantized level of the GaSb resonant tunneling layer to provide current flow through the transistor with the application of a specific potential to the terminal connected to the InAs resonant tunneling layer.

BRIEF DESCRIPTION OF THE DRAWINGS

Referring to the drawings wherein like characters indicate like parts throughout the various figures.

DESCRIPTION OF THE PREFERRED EMBODIMENTS

Figure 1:
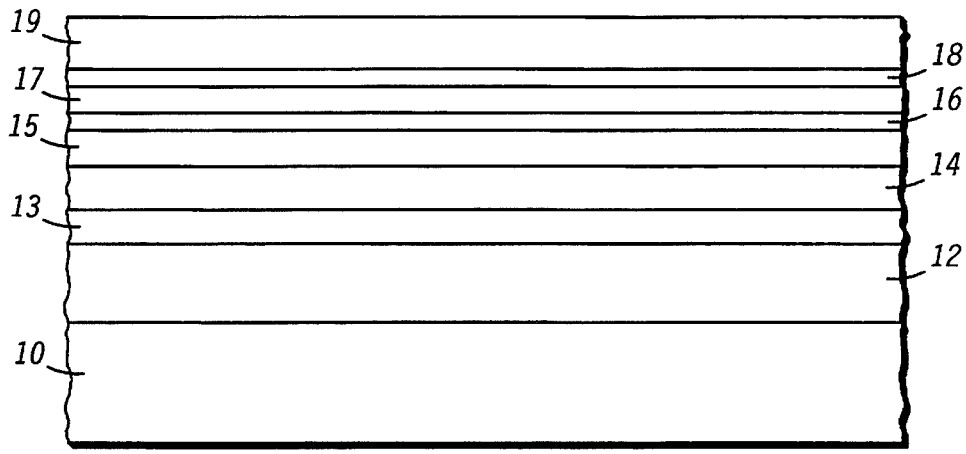
FIGS. 1 and 2 are simplified cross-sectional views of different structures in the fabrication of a band-to-band resonant tunneling transistor in accordance with the present invention.

Referring specifically to FIG. 1, a simplified cross-sectional view of a substrate 10 having a heterostructure of layers of material grown on a planar surface thereof is illustrated. While specific materials in a specific material system and specific layer thicknesses are utilized herein for example, it will be understood that some changes may be made without effecting the purpose herein described.

Substrate 10 is formed of gallium arsenide (GaAs) and a buffer layer 12 of aluminum antimonide/gallium antimonide (AlSb/GaSb) is epitaxially grown on the planar surface thereof to reduce crystal stress in subsequent layers. A first relatively heavily doped (n+) layer 13 of indium arsenide (InAs) is epitaxially grown on the surface of buffer layer 12. Layer 13 is doped, for example, with silicon ions or the like to a density of approximately $2 \times 10^{18}$ cm$^3$ to provide relatively good conductivity, for reasons that will become apparent presently. A relatively thick barrier layer 14 of aluminum antimonide (AlSb) is epitaxially grown on doped InAs layer 13. Barrier layer 14 is, for example, in the range of approximately 100 to 1000 angstroms thick. A resonant tunneling layer 15 of InAs is epitaxially grown on the surface of barrier layer 14 with a thickness of approximately 100 angstroms. A first relatively thin (approximately 25 angstroms) barrier layer 16 of AlSb is epitaxially grown on the surface of InAs resonant tunneling layer 15, followed by a resonant tunneling layer 17 of GaSb (less than 100 angstroms thick and preferably approximately 65 angstroms), and in turn followed by a second relatively thin barrier layer 18 of AlSb. A second relatively heavily doped layer 19 of InAs is epitaxially grown on barrier layer 18 as a final layer.

Figure 2:
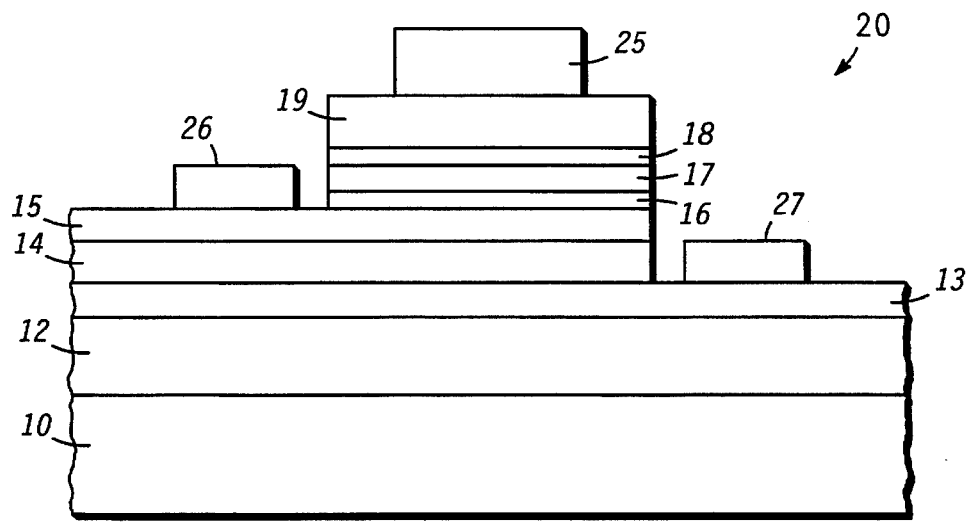

The structure of FIG. 1 is formed into a band-to-band tunneling transistor 20, illustrated in FIG. 2, by properly applying external ohmic contacts. A first ohmic contact 25 is formed with final InAs layer 19, which contact serves as an emitter for transistor 20. A second ohmic contact 26 is formed with InAs resonant tunneling layer 15 by some convenient method, such as etching layers 16 through 19, to expose a portion of the surface of InAs resonant tunneling layer 15. A third ohmic contact 27 is formed with doped InAs layer 13 by some convenient method, such as etching layers 14 through 19, to expose a portion of the surface of doped InAs layer 13. All of the contacts 25, 26 and 27 are formed of some convenient metal system, such as nickel-gold-germanium (NiAuGe) which is applied by any convenient method, such as evaporation and lift-off.

Figure 3:
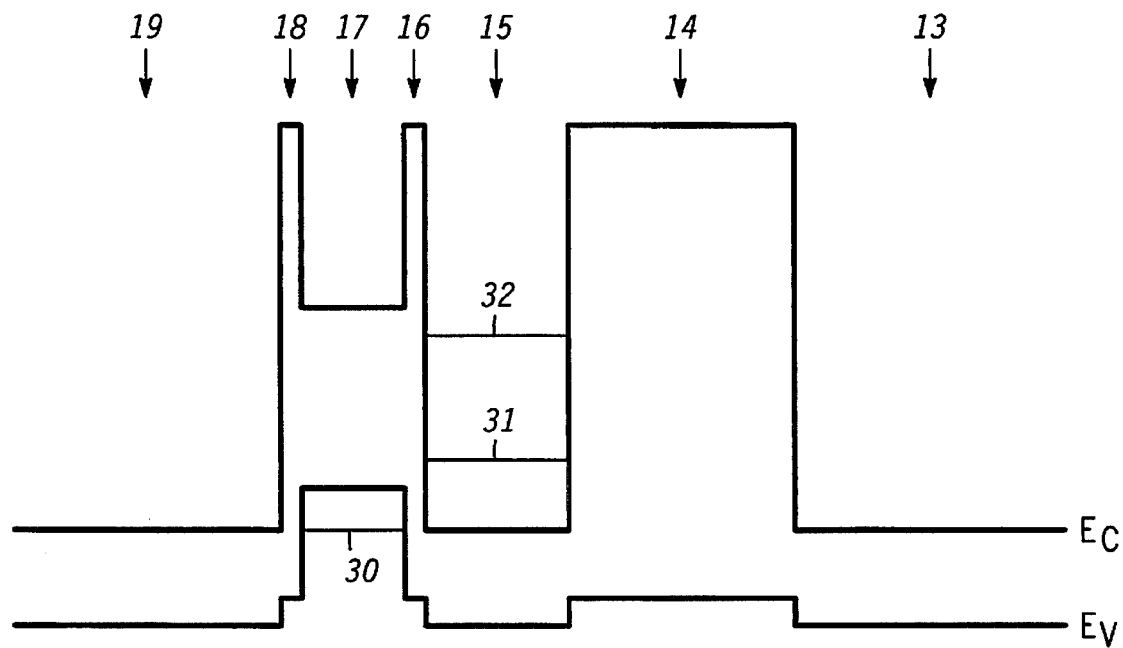
FIG. 3 is an energy band diagram for the structure of FIG. 2 with zero bias applied.

Band-to-band resonant tunneling transistor 20 is formed to operate with contact 25 being an emitter, contact 26 a collector and contact 27 a base. An unbiased energy band diagram for band-to-band resonant tunneling transistor 20 is illustrated in FIG. 3 to aid in the understanding of the operation thereof. As is generally understood by those skilled in the art, the lower line, $E_v$, of the energy diagram is representative of the valence band of the various layers of material, the upper line, $E_c$, is representative of the conduction band and the area between $E_v$ and $E_c$ is known as the bandgap. Each area of the diagram is designated with the number of the layer of material represented by that specific area with the top of transistor 20 being to the left in FIG. 3.

Beginning at the left in FIG. 3, the relatively narrow bandgap of InAs layer 19 is separated from the bandgap of GaSb resonant tunneling layer 17 by the relatively large bandgap of barrier layer 18. Further, the bandgap of GaSb resonant tunneling layer 17 is separated from the bandgap of InAs resonant tunneling layer 15 by the relatively large bandgap of barrier layer 16. Generally, barrier layers 16 and 18 have a relatively large bandgap to provide a barrier for the free flow of carriers thereacross but are formed very thin so that carriers can tunnel relatively easily between aligned energy bands. In this specific embodiment, GaSb resonant tunneling layer 17 is formed sufficiently thin to allow a ground state quantized level 30 in the valence band. InAs resonant tunneling layer 15 is formed sufficiently thin to provide a plurality of quantized levels 31 and 32 in the conduction band. At zero bias (represented by FIG. 3), ground state quantized level 30 in the valence band of GaSb resonant tunneling layer 17 is not aligned with either of quantized levels 31 and 32 in the conduction band of InAs resonant tunneling layer 15 and there is no current conduction between emitter 25 and collector 26.

Figure 4:
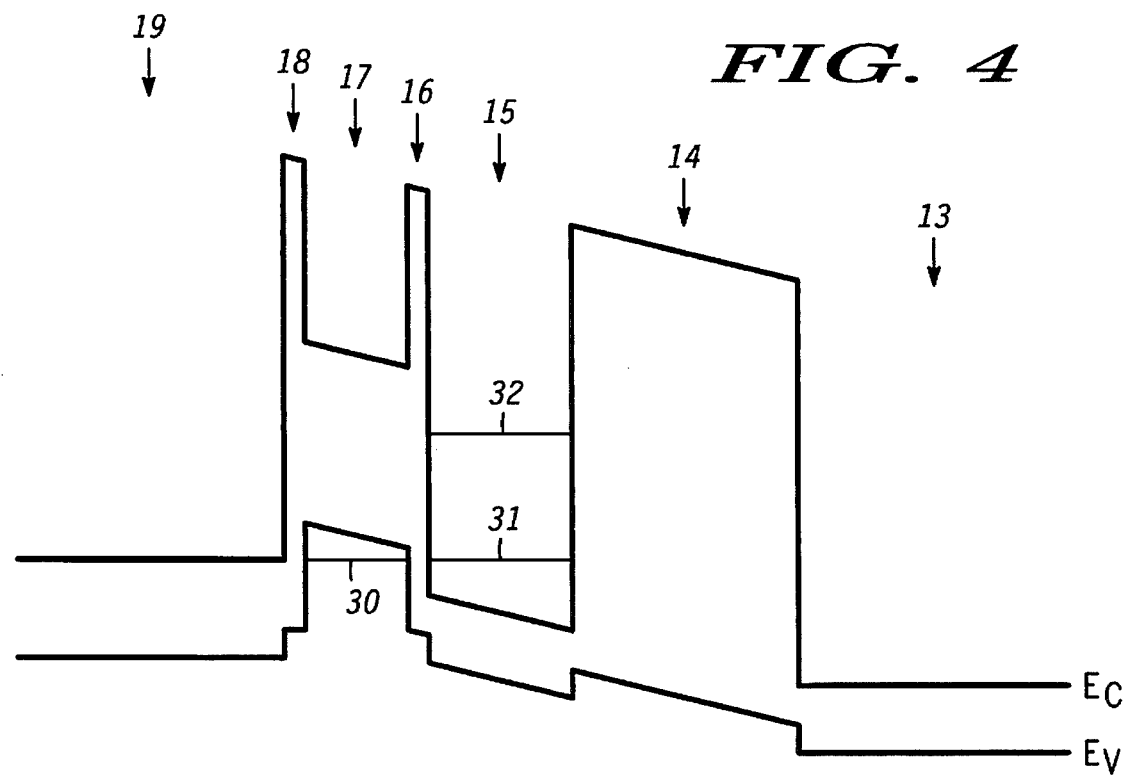
FIG. 4 is an energy band diagram for the structure of FIG. 2 with sufficient bias applied to cause alignment of different quantized levels of the tunneling layers.

By applying a positive bias voltage to base 27 of transistor 20, as illustrated in FIG. 4, the right side of the energy band diagram is drawn downward to alter the alignment of the quantized levels. In order to minimize the base-collector leakage current, the layer structure of transistor 20 is designed to be different than the normal bipolar transistor in which the base is positioned between the emitter and collector. Further, transistor 20 differs from a normal bipolar transistor in that it has a nonlinear transfer characteristic, sometimes referred to as negative differential resistance. In transistor 20, base 27 is separated from collector 26 by relatively thick barrier layer 14, which is thick enough to prevent tunneling and which, as can be seen from the diagram of FIG. 4, presents a bandgap that virtually prevents any transfer of electrons thereacross. Further, relatively heavily doped InAs layers 13 and 19 are included to provide low resistance access paths for emitter 25 and base 27.

The various layers of transistor 20 are selected and designed such that quantized level 31 in the conduction band of InAs resonant tunneling layer 15 is above ground state 30 in the valence band of GaSb resonant tunneling layer 17 at zero bias and no charge is transferred from emitter 25 to collector 26. By applying a bias voltage to base 27 of transistor 20 (illustrated in FIG. 4), ground state 30 in the valence band of GaSb resonant tunneling layer 17 is aligned with quantized level 31 in the conduction band of InAs resonant tunneling layer 15 and electrons are injected from emitter contact 25 and are collected by collector contact 26. Further increase in the base voltage misaligns quantized levels 30 and 31 and the current flow drops. As even further increase in the base voltage is applied, ground state 30 in the valence band of GaSb resonant tunneling layer 17 is aligned with quantized level 32 in the conduction band of InAs resonant tunneling layer 15 and current again increases.

Figure 5:
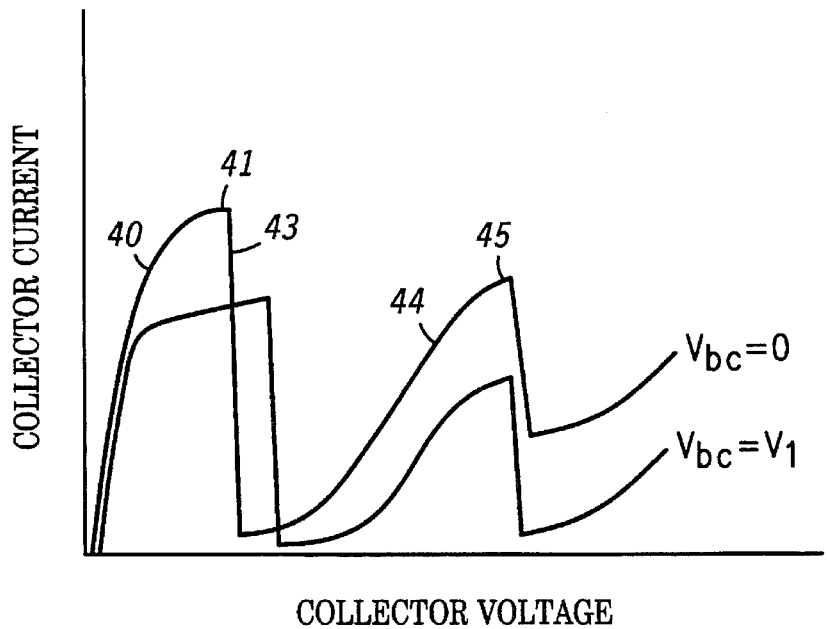
FIG. 5 is a graphic representation of collector current versus collector to emitter voltage in the structure of FIG. 2.

In a similar fashion, if the base voltage is held constant and a positive potential is applied to collector 26 quantized level 31 in the conduction band of InAs resonant tunneling layer 15 begins to drop and current will start to flow, with maximum current occurring when quantized levels 30 and 31 are aligned. Referring to FIG. 5 (the curve labeled Vbe=0), this situation is illustrated graphically by sloping line 40 and first peak 41. As quantized level 31 in InAs resonant tunneling layer 15 is lowered further than ground state 30 in the valence band of GaSb resonant tunneling layer 17, the conduction drops, as illustrated by portion 43 of the graphical representation. When the collector potential becomes great enough to align quantized level 32 in InAs resonant tunneling layer 15 with ground state 30 in the valence band of GaSb the current conduction will again increase, as illustrated by portion 44 of the graphical representation to a second peak 45. Base 27, in this specific instance, controls the maximum current and also effects the collector potential that results in the peaks and valleys, as indicated by the difference in curves Vbe=0 and Vbe=V1.

Figure 6:
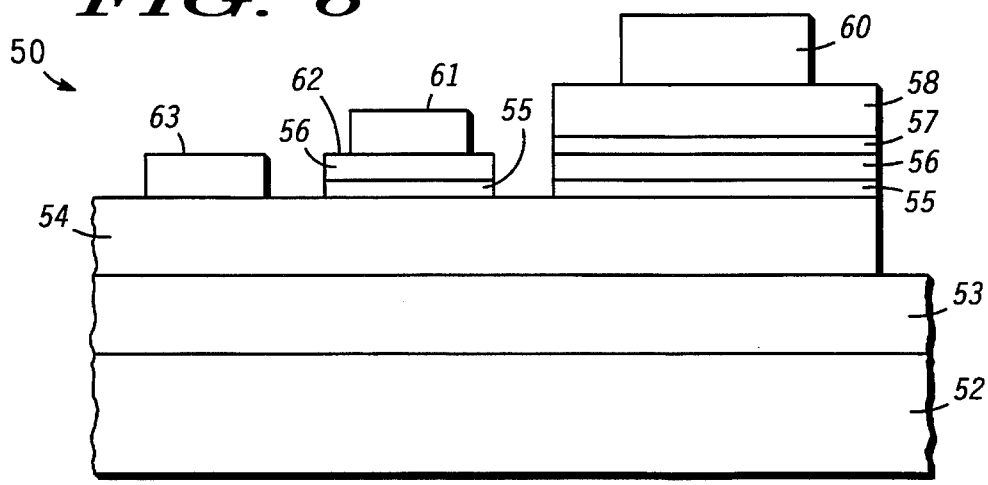
FIG. 6 is a simplified cross-sectional view of another band-to-band resonant tunneling transistor in accordance with the present invention.

Referring to FIG. 6, a simplified cross-sectional view of another band-to-band resonant tunneling transistor 50 is illustrated. In the fabrication of transistor 50, a substrate 52 is provided having a substantially planar surface. In the specific example to be described, substrate 52 is GaAs and an InAs/GaSb/AlSb material system is utilized for its convenience. A buffer layer 53 of AlSb/GaSb is epitaxially grown on the surface of substrate 52. A resonant tunneling layer 54 of InAs is epitaxially grown on the surface of buffer layer 53 with a thickness of approximately 100 angstroms. A first relatively thin (approximately 25 angstroms) barrier layer 55 of AlSb is epitaxially grown on the surface of InAs resonant tunneling layer 54, followed by a resonant tunneling layer 56 of GaSb (less than 100 angstroms thick and preferably approximately 65 angstroms), and in turn followed by a second relatively thin barrier layer 57 of AlSb. A relatively heavily doped (n+) layer 58 of InAs is epitaxially grown on barrier layer 57 as a final layer.

Figure 7:
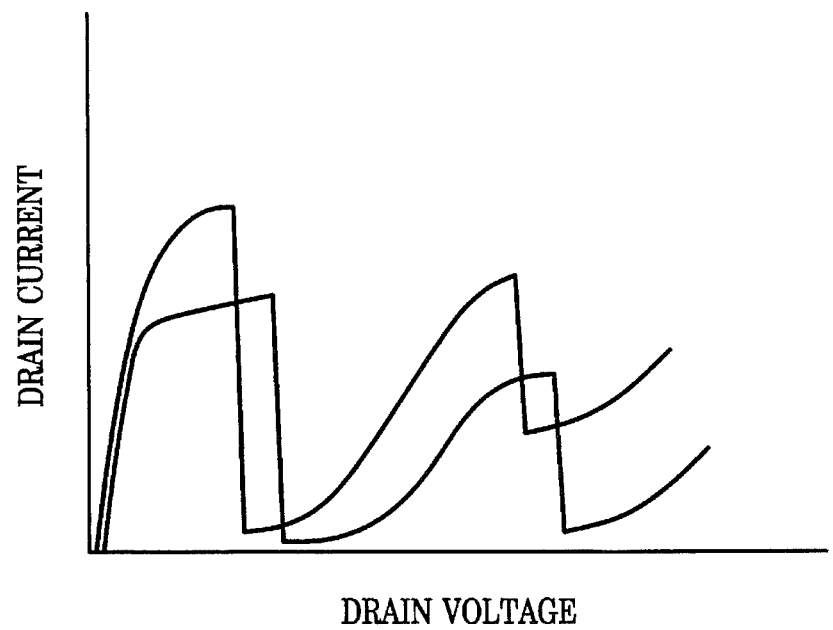
FIG. 7 is a graphic representation of the transfer characteristics of the Device illustrated in FIG. 6.

The above described layers are formed into transistor 50 by any convenient means, such as etching, selective epitaxial growth, etc. The structure of FIG. 6 is formed into band-to-band tunneling transistor 50 by properly applying external ohmic contacts. In this specific example, a drain contact 60 is formed on the surface of doped InAs layer 58 and an isolation trench is etched therearound to at least the surface of InAs resonant tunneling layer 54. Doped InAs layer 58 and barrier layer 57 are removed in other portions of transistor 50 and a gate contact 61 is formed on the surface of GaSb layer 56 in a portion 62. An isolation trench is etched around portion 62 to at least the surface of InAs resonant tunneling layer 54. GaSb layer 56 and barrier layer 55 are etched down to InAs resonant tunneling layer 54 at still another portion and source contact 63 is formed on the surface of InAs resonant tunneling layer 54. Thus, drain, gate, and source contacts are formed which are isolated from each other and which generally provide the operation of a resonant tunneling interband diode with negative differential resistance. That is, variations in gate voltage generally produce results as described above in conjunction with the base of transistor 20. Further, holding the gate potential constant and varying the drain potential produces the same multiple peak transfer characteristic described in conjunction with transistor 20, as illustrated in FIG. 7. Also, gate contact 61 is isolated from drain and source contacts by the barrier produced by layers 55 and 56, which substantially reduces current leakage.

The new and improved band-to-band resonant tunneling transistor has a substantially higher peak-to-valley current ratio because the structure is constructed with interband tunneling from a GaSb layer to an InAs layer which is two-dimensional-to-two-dimensional tunneling. Further, by providing a plurality of quantized levels in the InAs tunneling layer, multiple peak-to-valley two-dimensional-to-two-dimensional tunneling occurs. Thus, a new and improved band-to-band resonant tunneling transistor is disclosed with substantially increased peak-to-valley current. Further, because of the novel construction and arrangement, the new and improved band-to-band resonant tunneling transistor has minimized intercontact leakage current and substantially reduced access resistance.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A band-to-band resonant tunneling transistor comprising:

GaSb and InAs resonant tunneling layers separated by a thin barrier layer with a first terminal connected to the InAs resonant tunneling layer;

a second InAs layer separated from the GaSb resonant tunneling layer by another thin barrier layer with a second terminal connected to the second InAs layer;

a base or gate leakage current reduction material positioned adjacent the InAs resonant tunneling layer; and a base or gate terminal coupled to the InAs resonant tunneling layer through the leakage current reduction material for supplying a bias to the InAs resonant tunneling layer.

2. A band-to-band resonant tunneling transistor as claimed in claim 1 wherein the thin barrier layer separating the GaSb and InAs resonant tunneling layers includes AlSb.

3. A band-to-band resonant tunneling transistor as claimed in claim 1 wherein the another thin barrier layer includes AlSb.

4. A band-to-band resonant tunneling transistor as claimed in claim 1 wherein the leakage current reduction material includes a third InAs layer separated from the InAs resonant tunneling layer by a thick barrier layer with the base or gate terminal connected to the third InAs layer.

5. A band-to-band resonant tunneling transistor as claimed in claim 4 wherein the thick barrier layer includes AlSb.

6. A band-to-band resonant tunneling transistor as claimed in claim 4 wherein the second and third InAs layers are doped with impurities to provide electrical conduction.

7. A band-to-band resonant tunneling transistor as claimed in claim 1 wherein the leakage current reduction material includes a third barrier layer positioned on the InAs resonant tunneling layer and a GaSb layer positioned on the third barrier layer with the base or gate terminal positioned on the GaSb layer and coupled to the InAs resonant tunneling layer therethrough.

8. A band-to-band resonant tunneling transistor as claimed in claim 7 wherein the third barrier layer includes AlSb.

9. A band-to-band resonant tunneling transistor comprising:

GaSb and InAs resonant tunneling layers separated by a thin barrier layer with a collector terminal connected to the InAs resonant tunneling layer;

an InAs emitter layer separated from the GaSb resonant tunneling layer by another thin barrier layer with an emitter terminal connected to the InAs emitter layer; and an InAs base layer separated from the InAs resonant tunneling layer by a thick barrier layer with a base terminal connected to the InAs base layer.

10. A band-to-band resonant tunneling transistor as claimed in claim 9 wherein the thin barrier layer, the another thin barrier layer and the thick barrier layer are formed of AlSb.

11. A band-to-band resonant tunneling transistor as claimed in claim 9 wherein the InAs emitter layer and the InAs base layer are heavily doped with impurities to provide good conduction.

12. A band-to-band resonant tunneling transistor comprising:

a GaSb resonant tunneling layer sandwiched between first and second thin barrier layers, the GaSb resonant tunneling layer having a ground state quantized level;

an InAs resonant tunneling layer having the first relatively thin barrier layer positioned thereon, the resonant tunneling layer further having a collector terminal connected thereto and a quantized level;

a thick barrier layer having the InAs resonant tunneling layer positioned thereon;

a first doped base layer of InAs having the thick barrier layer positioned thereon, the first doped base layer further having a base terminal connected thereto, a second doped layer of InAs positioned on the second thin barrier layer with an emitter terminal attached to the second doped layer of InAs, the second doped layer of InAs having a conduction band approximately aligned with the ground state quantized level of the GaSb resonant tunneling layer and cooperating with the GaSb resonant tunneling layer to operate as a carrier emitter; and the quantized level of the InAs resonant tunneling layer being misaligned with the ground state quantized level of the GaSb resonant tunneling layer in a quiescent state, the quantized level of the InAs resonant tunneling layer being movable into alignment with the ground state quantized level of the GaSb resonant tunneling layer with an application of a predetermined mount of bias to the terminal connected to the first doped layer of InAs, at which time the terminal connected to the InAs resonant tunneling layer operates as a collector.

13. A band-to-band resonant tunneling transistor as claimed in claim 12 wherein the InAs resonant tunneling layer has a plurality of quantized states all of which are misaligned with the ground state quantized level of the GaSb resonant tunneling layer in a quiescent state, each of the quantized levels of the InAs resonant tunneling layer being movable into alignment with the ground state quantized level of the GaSb resonant tunneling layer with an application of a predetermined amount of potential to the terminal connected to the InAs resonant tunneling layer.

14. A band-to-band resonant tunneling transistor as claimed in claim 12 wherein the first and second thin barrier layers and the thick barrier layer are formed of AlSb.

15. A band-to-band resonant tunneling transistor comprising:

a GaAs substrate having a planar surface;

a buffer layer formed on the planar surface of the substrate;

a first base layer of InAs doped with impurities to provide conductivity positioned on the buffer layer, a base terminal positioned in contact with the first base layer of InAs;

a thick barrier layer positioned on the first layer of InAs;

an InAs resonant tunneling layer positioned on the thick barrier layer, the InAs resonant tunneling layer having a quantized level and a collector terminal connected to the InAs resonant tunneling layer;

a GaSb resonant tunneling layer sandwiched between first and second thin barrier layers with the first thin barrier layer positioned on the InAs resonant tunneling layer, the GaSb resonant tunneling layer having a ground state quantized level;

a second layer of InAs doped with impurities to provide conductivity positioned on the second thin barrier layer, an emitter terminal positioned in contact with the second layer of InAs, the second layer of InAs having a conduction band approximately aligned with the ground state quantized level of the GaSb resonant tunneling layer and cooperating with the GaSb resonant tunneling layer to operate as a carrier emitter; and the quantized level of the InAs resonant tunneling layer being misaligned with the ground state quantized level of the GaSb resonant tunneling layer in a quiescent state, the quantized level of the InAs resonant tunneling layer being movable into alignment with the ground state quantized level of the GaSb resonant tunneling layer with an application of a predetermined mount of bias to the base terminal connected to the first layer of InAs, at which time the collector terminal connected to the InAs resonant tunneling layer operates as a collector of carriers.

16. A band-to-band resonant tunneling transistor as claimed in claim 15 wherein the InAs resonant tunneling layer has a plurality of quantized states all of which are misaligned with the ground state quantized level of the GaSb resonant tunneling layer in a quiescent state, each of the quantized levels of the InAs resonant tunneling layer being movable into alignment with the ground state quantized level of the GaSb resonant tunneling layer with an application of a predetermined amount of potential to the terminal connected to the InAs resonant tunneling layer.

17. A band-to-band resonant tunneling transistor as claimed in claim 15 wherein the first and second thin barrier layers and the thick barrier layer are formed on AlSb.

18. A band-to-band resonant tunneling transistor comprising:

a GaAs substrate having a planar surface;

a buffer layer formed on the planar surface of the substrate;

an InAs resonant tunneling layer positioned on the buffer layer, the InAs resonant tunneling layer having a quantized level and a terminal connected to the InAs resonant tunneling layer;

a first thin barrier layer positioned on the InAs resonant tunneling layer and a GaSb resonant tunneling layer positioned on the first thin barrier layer, the GaSb resonant tunneling layer having a ground state quantized level;

the first thin barrier layer and the GaSb resonant tunneling layer being separated into first and second portions with a terminal positioned on the GaSb resonant tunneling layer in the first portion;

a second thin barrier layer positioned on the GaSb resonant tunneling layer in the second portion;

a second layer of InAs doped with impurities to provide conductivity positioned on the second thin barrier layer, a terminal positioned in contact with the second layer of InAs, the second layer of InAs having a conduction band approximately aligned with the ground state quantized level of the GaSb resonant tunneling layer; and the quantized level of the InAs resonant tunneling layer being misaligned with the ground state quantized level of the GaSb resonant tunneling layer in a quiescent state, the quantized level of the InAs resonant tunneling layer being movable into alignment with the ground state quantized level of the GaSb resonant tunneling layer with an application of a predetermined mount of bias to the terminal connected to the GaSb resonant tunneling layer in the first portion.

19. A band-to-band resonant tunneling transistor as claimed in claim 18 wherein the terminal positioned in contact with the second layer of InAs is a drain, the terminal connected to the InAs resonant tunneling layer is a source and the term anal positioned on the GaSb resonant tunneling layer in the first portion is a gate for a transistor.

20. A band-to-band resonant tunneling transistor as claimed in claim 18 wherein the InAs resonant tunneling layer has a plurality of quantized states all of which are misaligned with the ground state quantized level of the GaSb resonant tunneling layer in a quiescent state, each of the quantized levels of the InAs resonant tunneling layer being movable into alignment with the ground state quantized level of the GaSb resonant tunneling layer with an application of a predetermined amount of potential to the terminal connected to the InAs resonant tunneling layer.

21. A band-to-band resonant tunneling transistor as claimed in claim 18 wherein the first and second thin barrier layers are formed on AlSb.

* * * * *